United States Patent
Tang et al.

(10) Patent No.: US 7,579,612 B2
(45) Date of Patent: Aug. 25, 2009

(54) RESISTIVE MEMORY DEVICE HAVING ENHANCED RESIST RATIO AND METHOD OF MANUFACTURING SAME

(75) Inventors: Denny Tang, Saratoga, CA (US); Tai-Bor Wu, Hsinchu (TW); Wen-Yuan Chang, Taipei (TW); Tzyh-Cheang Lee, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 300 days.

(21) Appl. No.: 11/739,942

(22) Filed: Apr. 25, 2007

(65) Prior Publication Data

US 2008/0266931 A1 Oct. 30, 2008

(51) Int. Cl.
*H01L 47/00* (2006.01)
(52) U.S. Cl. .................. 257/2; 257/4; 257/E27.006; 257/E27.104
(58) Field of Classification Search .................. 257/2, 257/3, 4, 295, 421, E27.006, E27.104
See application file for complete search history.

(56) References Cited

U.S. PATENT DOCUMENTS 7,504,653 B2 * 3/2009 Lung ..................... 257/2

* cited by examiner

*Primary Examiner*—Hoai v Pham
(74) *Attorney, Agent, or Firm*—Baker & McKenzie LLP

(57) ABSTRACT

Disclosed herein are new resistive memory devices having one or more buffers layer surrounding a dielectric layer. By inserting one or more buffer layers around the dielectric layer of the device, the resistive ratio of the device is highly enhanced. For example, tests using this unique stack structure have revealed a resistance ratio of approximately 1000× over conventional electrode-dielectric-electrode stack structures found in resistive memory devices. This improvement in the resistance ratio of the resistive memory device is believed to be from the improved interface coherence, and thus smoother topography, between the buffer layer(s) and the dielectric layer.

14 Claims, 9 Drawing Sheets

RESISTIVE MEMORY DEVICE HAVING ENHANCED RESIST RATIO AND METHOD OF MANUFACTURING SAME

TECHNICAL FIELD

Disclosed embodiments herein relate generally to information storage of integrated circuit memory devices, and more particularly to a resistive memory device having a buffer layer to enhance the resist ratio of the memory device.

BACKGROUND

With conventional memory cell structures approaching their scaling limit, many types of memory cell structures have attracted extensive research. For example, variable resistive element type memory cells, such as magnetic random access memory (MRAM), resistive random access memory (RRAM), and the like have continued to gain popularity. In variable resistive memory cells, the difference in storage state appears as the difference between threshold voltages of the memory transistor. Among resistive memory, RRAM is a good candidate for use in low-scale applications due to a low operating voltage, fast access time, and good endurance.

The basic component of an RRAM cell is a variable resistor. The variable resistor can be programmed to have high resistance or low resistance (in two-state memory circuits), or any intermediate resistance value (in multi-state memory circuits). The different resistance values of the RRAM cell represent the information stored in the RRAM circuit. The advantages of RRAM are the simplicity of the circuit (leading to smaller devices), the non-volatile characteristic of the resistor memory cell, and the stability of the memory state.

Since a resistor is a passive component and cannot be actively influence nearby electrical components, a basic RRAM cell can be just a variable resistor, arranged in a cross point resistor network to form a cross point memory array. To prevent cross talk or parasitic current paths, a RRAM cell can further include a diode, and this combination is sometimes called a 1R1D (or 1D1R) cross point memory cell. To provide better access, an RRAM cell can include an access transistor, and this combination is sometimes called a 1R1T (or 1T1R) cross point memory cell.

The resistance state of an RRAM cell is referred to the storing (writing) or sensing (reading) methodology of the RRAM circuit. The term resistance state is related to the resistance value of the memory resistor (the resistance state can then be said to be the resistance of the memory resistor), but sensing the resistance value of the memory resistor often means sensing the voltage across the memory resistor (the resistance state can then be said to be the voltage across the memory resistor), or sensing the current through the memory resistor (the resistance state then can be said to be the current through the memory resistor).

In conventional manufacturing processes for RRAM cells, a dielectric is sandwiched between a top electrode and a bottom electrode. One example of a structural state for an RRAM cell is a chalcogenide alloy serving as the dielectric material. Such RRAM cells are typically called phase change memory (PCM) cells. Chalcogenide alloys can exhibit two different stable reversible structural states, namely an amorphous state with high electrical resistance and a polycrystalline state with lower electrical resistance. Resistive heating by an electrical current can be used to change the phase of the chalcogenide materials.

Other RRAM structures include the use of a (manganite) Colossal magnetoresistive (CMR) material as the dielectric material sandwiched between the electrodes. Other types of RRAM devices include electric-pulse-induced resistance (EPIR) devices. The EPIR effect encompasses the reversible change of resistance of a thin-oxide film, such as $Pr_{1-x} Ca_x MnO_3$ (PCMO), under the application of short, low voltage pulses. The information can be stored (or written) to such an RRAM device by applying the voltage pulses to the CMR material. The information can then be sensed (or read) by sensing the resistance across the CMR material using a constant current source, or by sensing the current through the CMR material using a constant voltage source. However, the typical structure of such a dielectric material sandwiched between two electrodes often results in the resist ratio of conventional RRAM cells ($R_{on}/R_{off}$) to be relatively low and is often difficult to sense in certain applications. Accordingly, an increased resistance ratio for these type of RRAM cells is desired.

SUMMARY

Disclosed herein are new resistive memory devices having one or more buffers layer surrounding a dielectric layer. By inserting one or more buffer layers around the dielectric layer of the device, the resistive ratio of the device is highly enhanced. For example, tests using this unique stack structure have revealed a resistance ratio of approximately 1000× over conventional electrode-dielectric-electrode stack structures found in resistive memory devices. This improvement in the resistance ratio of the resistive memory device is believed to be from the improved interface coherence, and thus smoother topography, between the buffer layer(s) and the dielectric layer.

In one aspect, non-volatile resistive memory device is provided. In one embodiment, device comprises a first electrode formed on a substrate, and a first buffer layer formed on the first electrode and having a crystalline structure with a first orientation. The device also comprises a dielectric layer formed on the first buffer and having substantially the same crystalline structure with the first orientation as the first buffer layer. In such a structure, a resistive ratio of the dielectric layer formed on the first buffer layer is greater than a resistive ratio of a device having the dielectric layer formed on the first electrode. Such devices then have a second electrode formed over the dielectric layer.

In another aspect, a resistive random access memory stack is provided. In one embodiment, the RRAM stack comprises a first electrode formed on a substrate, and a first buffer layer formed on the first electrode and having a crystalline structure with a first orientation controlled by its formation process. In such embodiments, the RRAM stack further comprises a dielectric layer comprising a Colossal magnetoresistive (CMR) material and formed on the first buffer, wherein the dielectric layer has a crystalline structure with an orientation that is self-aligned to the crystalline structure and orientation of the first buffer layer during a formation process for the dielectric layer. Through this process, a resistive ratio of the dielectric layer formed on the first buffer layer is greater than a resistive ratio of a device having the dielectric layer formed on the first electrode. Such embodiments may also include a second buffer layer formed on the dielectric layer and having a crystalline structure with an orientation self-aligned to the crystalline structure and orientation of the dielectric layer during a formation process for the second buffer layer. Then, the RRAM stack comprises a second electrode formed on the second buffer layer.

In yet another aspect, a method of manufacturing a non-volatile resistive memory device is provided. In one embodiment, the method comprises forming a first electrode formed on a substrate, and forming a first buffer layer on the first electrode and with a crystalline structure having a first orientation. Such a method further comprises forming a dielectric layer on the first buffer so as to self-align the crystalline structure and orientation of the dielectric layer with the crystalline structure and orientation of the first buffer layer in devices formed with such methods, a resistive ratio of the dielectric layer formed on the first buffer layer is greater than a resistive ratio of a device having the dielectric layer formed on the first electrode. Such embodiments may then comprise forming a second electrode over the dielectric layer.

BRIEF DESCRIPTION OF THE DRAWINGS

For a more complete understanding of the principles disclosed herein and the advantages thereof, reference is now made to the following descriptions taken in conjunction with the accompanying drawings, in which.

DETAILED DESCRIPTION

Figure 1:
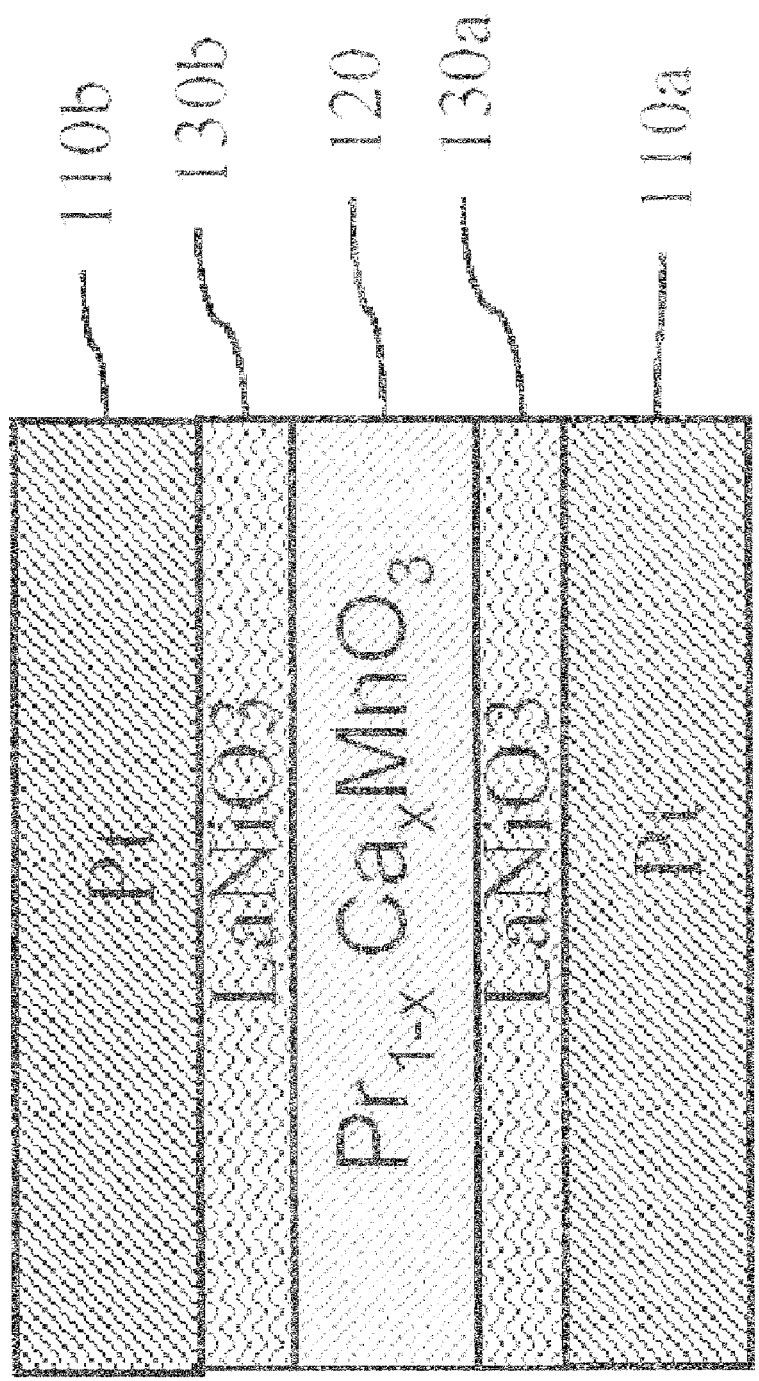
FIG. 1 illustrates one embodiment of a resistive random access memory (RRAM) stack for use in an RRAM cell structure and constructed according to the principles disclosed herein.

Referring initially to FIG. 1, illustrated is one embodiment of a resistive random access memory (RRAM) stack 100 for use in an RRAM cell structure and constructed according to the principles disclosed herein. The RRAM stack 100 includes bottom and top electrodes 110a, 110b, as previously known. In exemplary embodiments, the bottom and top electrodes 110a, 110b may be manufactured from electrically conductive materials. For examples, the bottom and top electrodes 110a, 110b may be constructed of platinum (Pt), however any advantageous conductive material may be employed.

The RRAM stack 100 also includes a central dielectric layer 120 between the bottom and top electrodes 110a, 110b. In typical embodiments, the dielectric layer 120 is constructed of a Colossal magnetoresistive (CMR) material. In this specific embodiment, the dielectric layer 120 is constructed of the dielectric material $Pr_{1-x}Ca_xMnO_3$ (PCMO). Of course, any dielectric material advantageous for use in an RRAM stack 100 may also be employed.

In addition, in accordance with the disclosed principles, the illustrated RRAM stack 100 also includes lower and upper buffers layer 130a, 130b. More specifically, the lower buffer layer 130a is located between the bottom electrode 110a and the central dielectric layer 120, while the upper buffer layer 130b is located between the central dielectric layer 120 and the upper electrode 110b. In the illustrated embodiment of FIG. 1, the buffer layers 130a, 130b are both constructed of the material $LaNiO_3$ ("LNO"). By inserting LNO buffer layers 130a, 130b between the electrodes 110a, 110b and the dielectric layer 120, the resistance ratio of the RRAM stack 100 is highly enhanced. For example, as discussed in more detail below, the tests using this unique stack structure revealed a resistance ratio of approximately 1000× over conventional electrode-dielectric-electrode RRAM stack structures. This improvement in the resistance ratio of the RRAM stack 100 is believed to be from the improved interface coherence between the LNO buffer layer 130a, 130b and the PCMO dielectric layer 120.

Figure 1A:
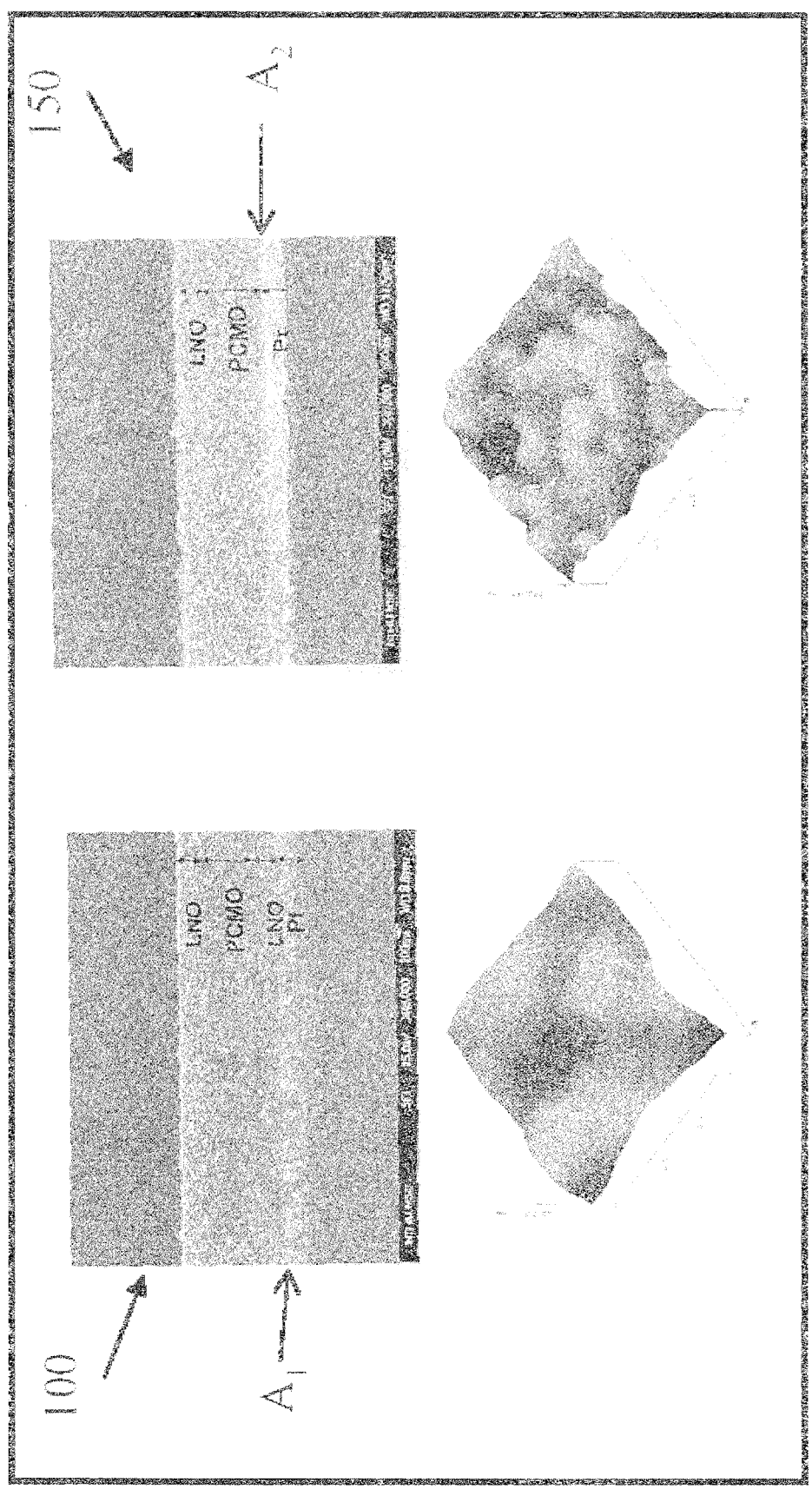
FIG. 1A illustrates the differences in topography between RRAM stack layer with and without the disclosed buffer layer.

A comparison of the topography of the interface between the LNO buffer layer 130a, 130b and the PCMO dielectric layer to the topography of the interface directly between metal electrodes 110a, 110b and a PCMO dielectric layer 120 found in a conventional RRAM stack is illustrated in FIG. 1A. The left side of FIG. 1A illustrates an SEM scan of the RRAM stack 100 constructed with the lower and upper buffer layers 130a, 130b, while the right side of FIG. 1A illustrates an SEM scan of an RRAM stack 150 not having an LNO buffer layer between the bottom electrode and the PCMO dielectric layer 120. The interface of the lower LNO buffer layer 130a and the bottom electrode 110a in RRAM stack 100 is indicated with arrow $A_1$, while the interface of the bottom electrode and the dielectric layer in the second stack 150 is indicated with arrow $A_2$. The smoothed topography of the RRAM stack 100 having the LNO buffer layer is unmistakable.

Figure 2:
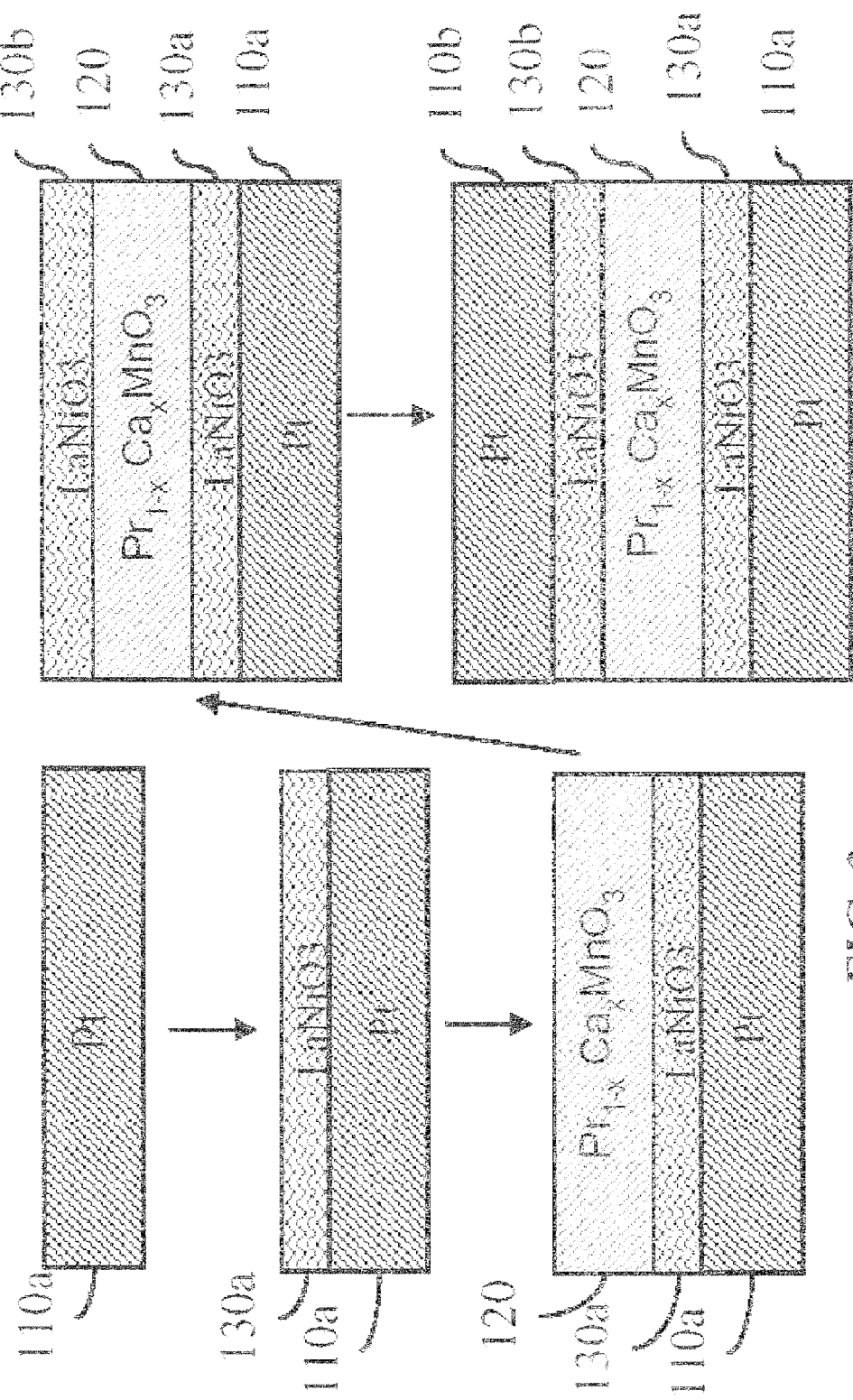
FIG. 2 illustrates a manufacturing process for constructing the RRAM stack disclosed in FIG. 1.

FIG. 2 illustrates a manufacturing process for constructing the RRAM stack disclosed in FIG. 1. The process begins with the formation of the bottom electrode layer, using, for example, the electrically conductive materials discussed above. In the next step of the process, the bottom buffer layer 130a is formed directly on the bottom electrode 110a. As discussed before, although LNO is illustrated, any material providing the improved interface discussed above may also be employed. Next in the process is the formation of the central dielectric layer 120, directly on the lower buffer layer 130a. In this embodiment, PCMO dielectric material is again used.

Once the dielectric layer 120 is formed, the next step in the process may be to form the upper buffer layer 130b directly on the central dielectric layer 120. It should be noted, however, that the disclosed principles do not require the formation of both the lower and upper buffer layers 130a, 130b to provide an improved RRAM stack. Even by forming only one of the two buffer layers 130a, 130b, an improved topography between at least one surface of the dielectric layer is provided, thus increasing the resistance ratio of the finished RRAM stack 100. After the formation of the upper buffer layer 130b, if desired, the next step in the process is the formation of the upper electrode 110b directly on the upper buffer layer 130b. Once the desired layers of the RRAM stack 100 have been formed, the substrate may be patterned and etched, for example, using conventional photolithographic techniques, to form the finished RRAM stacks 100. It should be noted that the manufacturing process discussed above may also include additional steps that have been omitted in the present disclosure for simplifying the discussion herein.

As discussed above, the increased resistance ratio of the RRAM stack is provided by forming buffer layers around the central dielectric layer in accordance with the disclosed principles. The smooth topography at these interfaces provides this increased resistance ratio by improving coherence between these layers. Thus, while the examples disclosed herein employ LNO buffer layer(s) formed on a PCMO dielectric layer, other materials may also be employed. More specifically, a buffer layer may be formed on the bottom electrode at an orientation controlled by the formation (e.g., deposition) process. Then, a dielectric layer is formed directly adjacent to the buffer layer that has the same crystal structure as the buffer layer, and that has an orientation that is self-aligned to the buffer layer. Then, if an upper buffer layer is employed in the RRAM stack, the upper buffer layer is formed from the material as the lower buffer layer, and its orientation is self-aligned to the dielectric layer. By following these principles, increased coherence between the dielectric layer and one or both buffer layers can be obtained, and therefore resistance ratio of the RRAM stack is improved.

Figure 3:
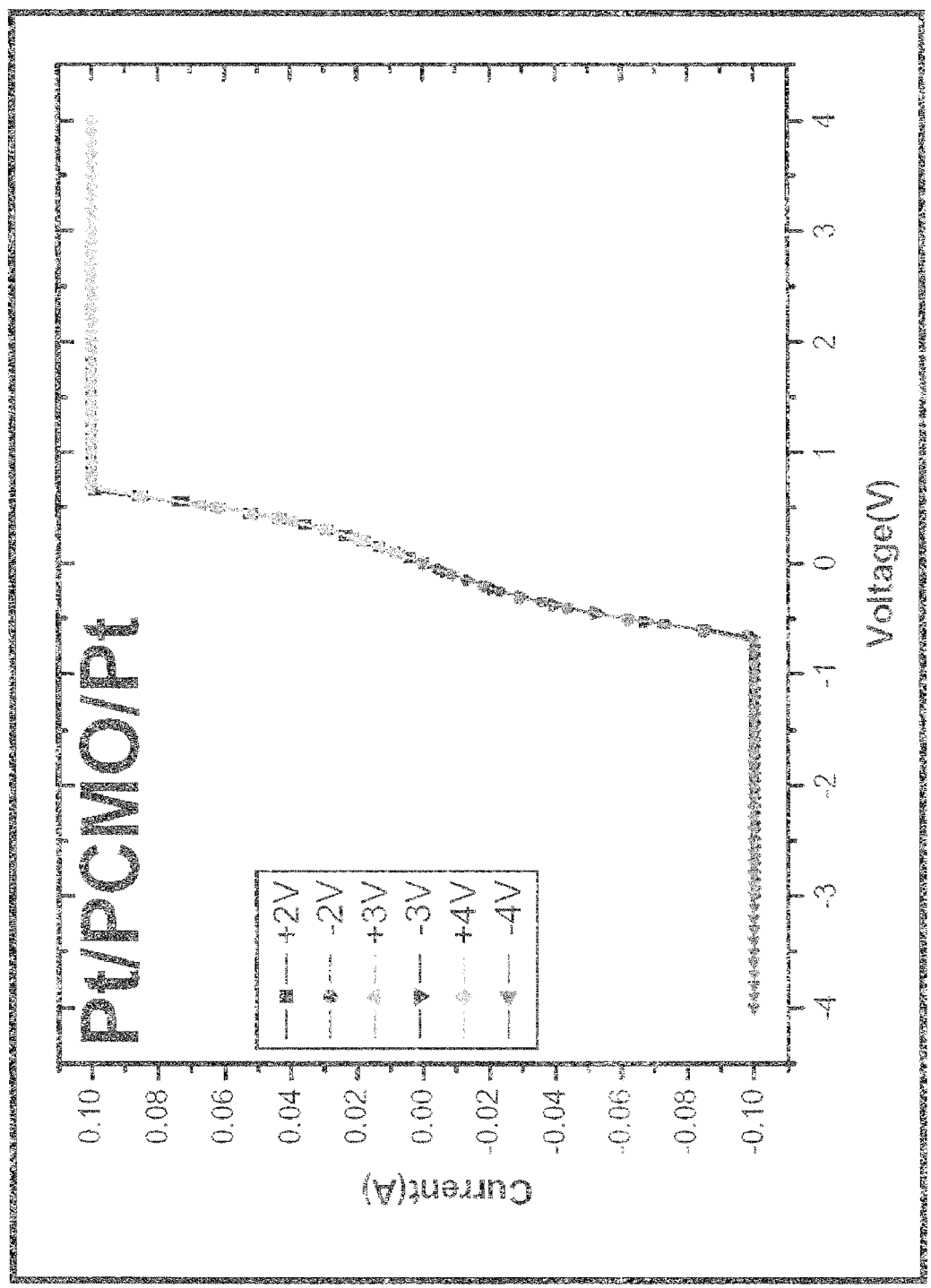
FIG. 3 illustrates hysteresis in the current-voltage curve for a conventional RRAM stack have no buffer layer between the central dielectric layer and the bottom and top electrodes.
Figure 4:
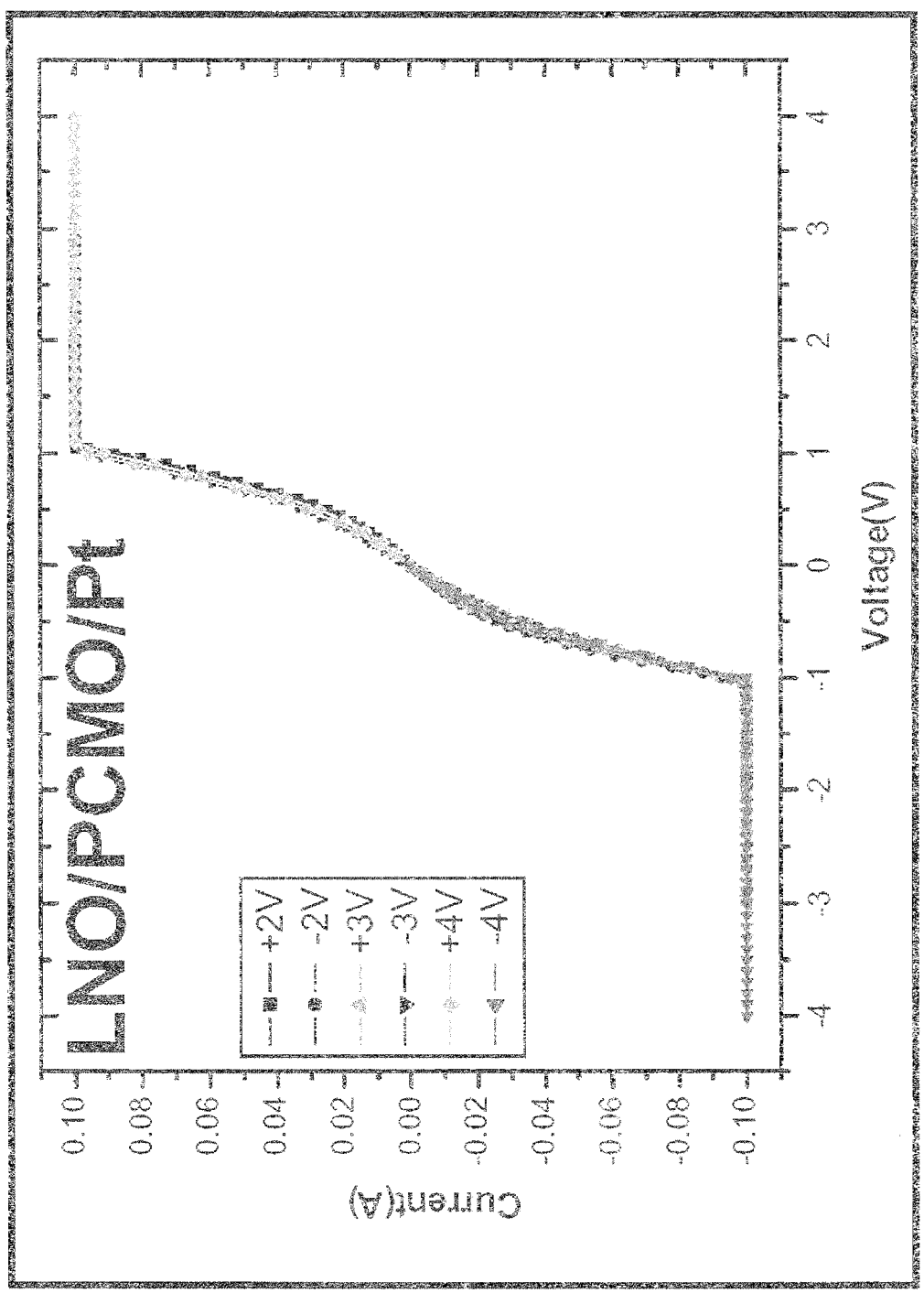
FIG. 4 illustrates hysteresis in the current-voltage curve for an RRAM stack having only an upper LNO buffer layer formed on a PCMO dielectric layer, which is formed directly on a Pt electrode.
Figure 5:
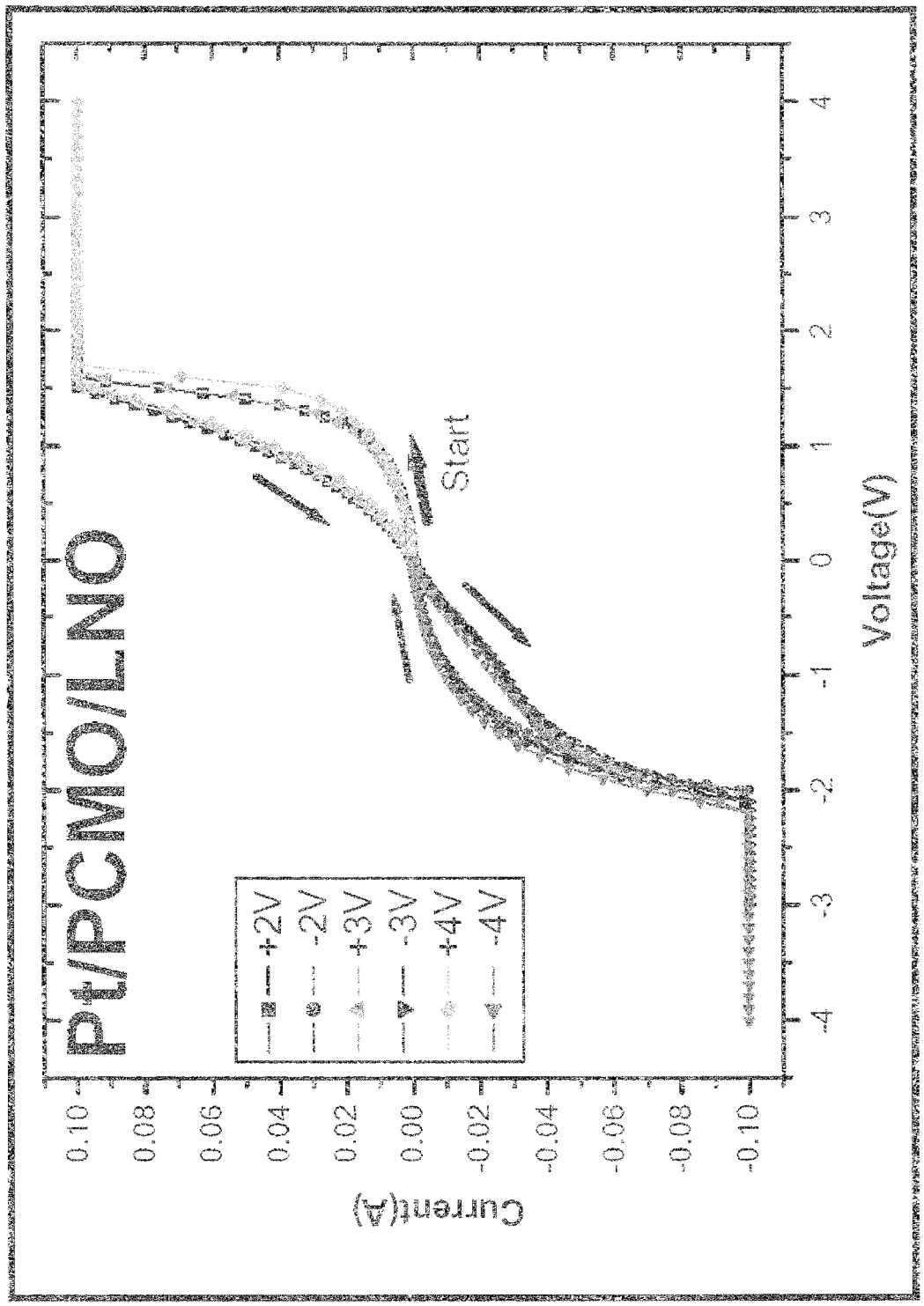
FIG. 5 illustrates hysteresis in the current-voltage curve for an RRAM stack having only a lower LNO buffer layer with a PCMO dielectric layer formed directly on it, and a Pt electrode formed directly on the dielectric layer.
Figure 6:
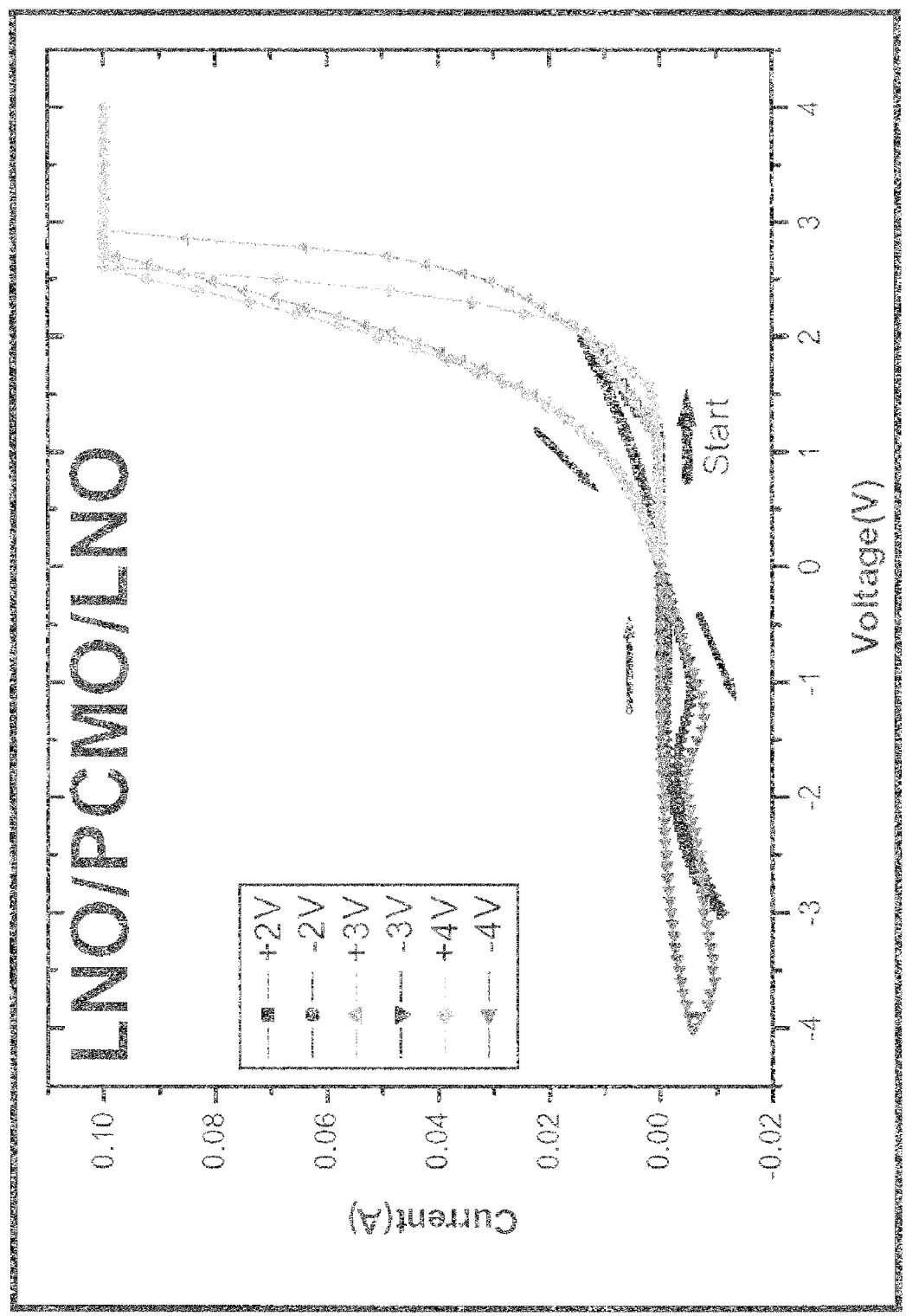
FIG. 6 illustrates hysteresis in the current-voltage curve for an RRAM stack having both lower and upper LNO buffer layers sandwiching a PCMO dielectric layer.

FIGS. 3-6 illustrate plots of hysteresis in the current-voltage curves for various RRAM stacks. Specifically, FIG. 3 illustrates hysteresis in the current-voltage curve for a conventional RRAM stack have no buffer layer between the central dielectric layer and the bottom and top electrodes. FIG. 4 illustrates hysteresis in the current-voltage curve for an RRAM stack having only an upper LNO buffer layer formed directly on a PCMO dielectric layer, which is formed directly on a Pt electrode. FIG. 5 illustrates hysteresis in the current-voltage curve for an RRAM stack having only a lower LNO buffer layer with a PCMO dielectric layer formed directly on it, and a Pt electrode formed directly on the dielectric layer. Finally, FIG. 6 illustrates hysteresis in the current-voltage curve for an RRAM stack having both lower and upper LNO buffer layers sandwiching a PCMO dielectric layer. The increase in resistance ratio for RRAM stacks constructed with at least a lower LNO buffer layer is illustrated in the results of the various hysteresis curves, particularly with regard to the hysteresis curve in FIG. 6 for an RRAM stack having both lower and upper LNO buffer layers.

Figure 7:
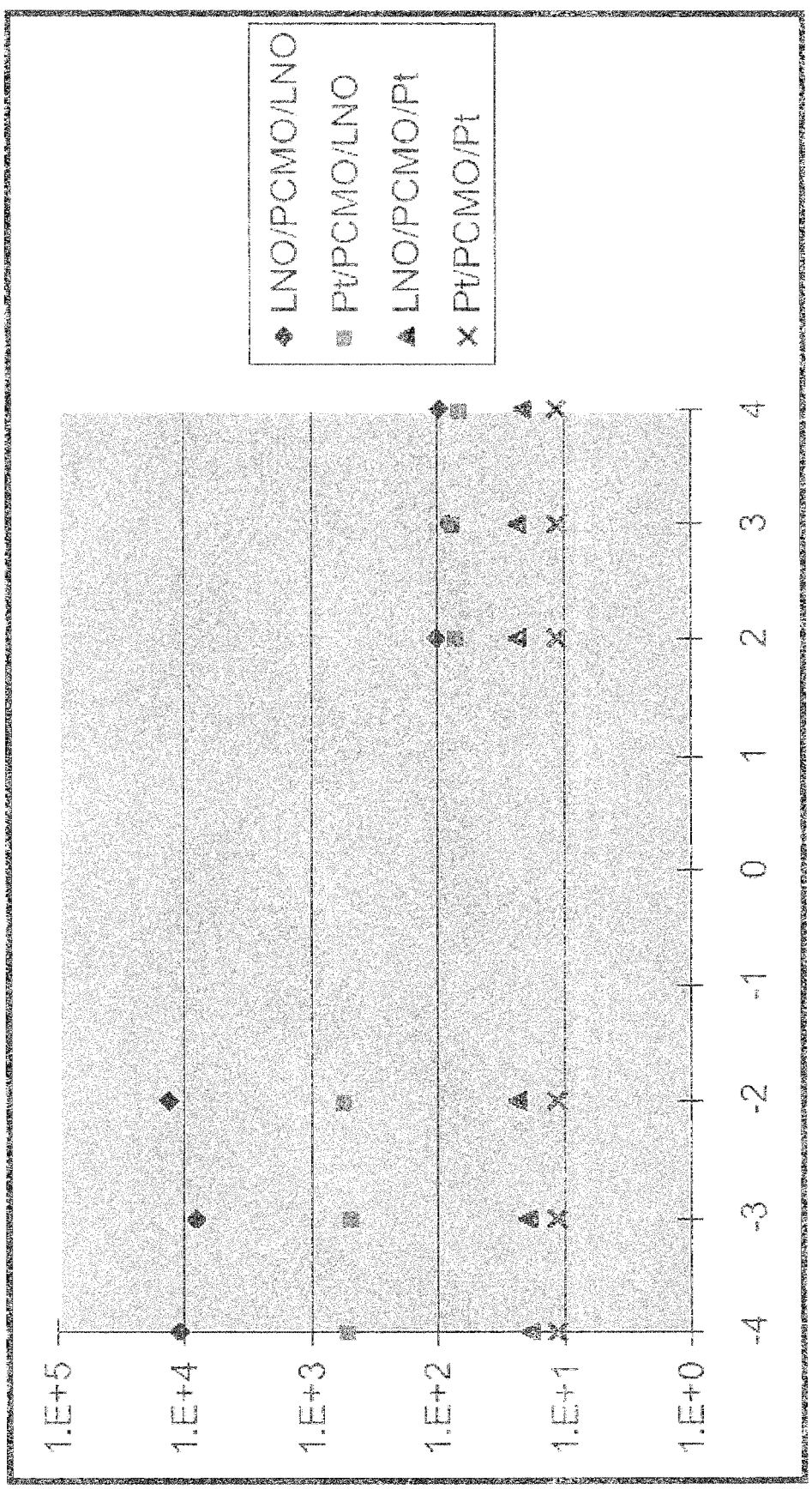
FIG. 7 illustrates a plot further depicting the improved resistance ratio ($R_{on}/R_{off}$) of those RRAM stacks having one or both buffer layers constructed as disclosed herein.

FIG. 7 illustrates plots of resistance [R(ohm)] as a function of set voltage [V(voltage)] that additionally illustrate the improved resistance ratio ($R_{on}/R_{off}$) of those RRAM stacks having a lower or both buffer layers constructed as disclosed herein (specifically, these plots correspond to the RRAM stack embodiments for each of the hysteresis curves in FIGS. 3-6).

Figure 8:
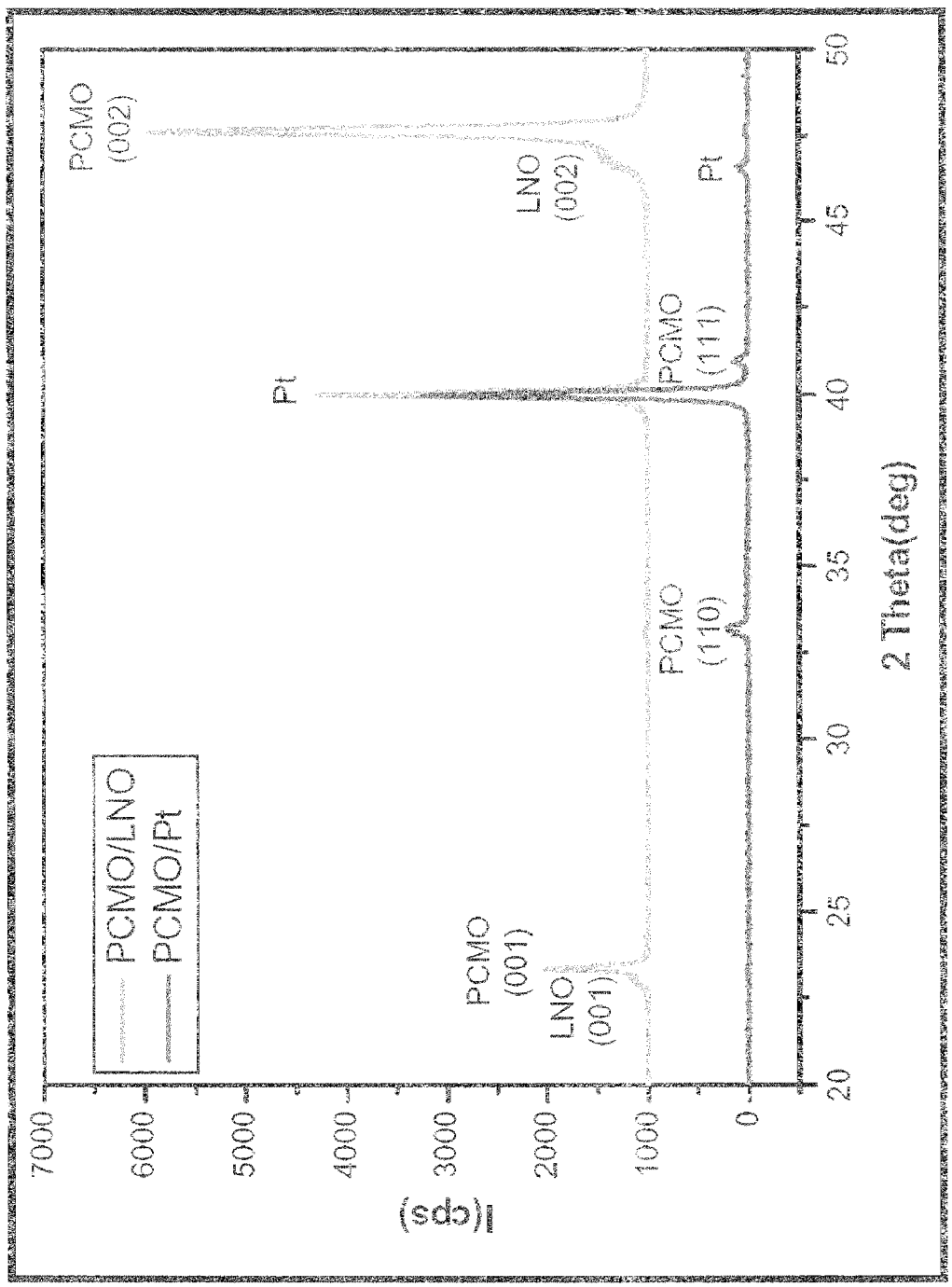
FIG. 8 illustrates a plot showing the improved crystallinity of a PCMO dielectric layer when formed directly on an LNO buffer layer.

FIG. 8 illustrates plots of X-ray diffraction intensity [1(cps)] as a function of angle [2 Theta(deg)] for a PCMO dielectric layer formed directly on an LNO buffer layer. These plots illustrate that employing a lower LNO buffer layer on the bottom electrode, and forming the PCMO dielectric layer directly on the buffer layer can control the orientation and thus improve the crystallinity of the PCMO dielectric layer. Specifically, as shown in FIG. 8, the PCMO films exhibit orientation (001)—the preferred orientation—when formed on an LNO buffer layer, but exhibit random orientation (e.g., orientations (110) and (111) when formed directly on a Pt electrode. In addition, these results show that the PCMO dielectric layer follow the orientation of the LNO buffer layer, even when it is not the preferred orientation (for example, the orientation (002) of the PCMO layer on the orientation (002) LNO buffer layer).

While various embodiments of the disclosed principles have been described above, it should be understood that they have been presented by way of example only, and not limitation. Thus, the breadth and scope of the invention(s) should not be limited by any of the above-described exemplary embodiments, but should be defined only in accordance with any claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 C.F.R. 1.77 or otherwise to provide organizational cues. These headings shall not limit or characterize the invention(s) set out in any claims that may issue from this disclosure. Specifically and by way of example, although the headings refer to a "Technical Field," such claims should not be limited by the language chosen under this heading to describe the so-called technical field. Further, a description of a technology in the "Background" is not to be construed as an admission that technology is prior art to any invention(s) in this disclosure. Neither is the "Brief Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. A non-volatile resistive memory device, comprising:
   a first electrode formed on a substrate;
   a first buffer layer formed on the first electrode and having a crystalline structure with a first orientation;
   a dielectric layer formed on the first buffer and having substantially the same crystalline structure with the first orientation as the first buffer layer, wherein a resistive ratio of the dielectric layer formed on the first buffer layer is greater than a resistive ratio of a device having the dielectric layer formed on the first electrode; and
   a second electrode formed over the dielectric layer.

2. A resistive memory device according to claim 1, wherein the first and second electrodes comprise platinum.

3. A resistive memory device according to claim 1, wherein the orientation of the first buffer layer is controlled by its formation process.

4. A resistive memory device according to claim 1, wherein the crystalline structure and orientation of the dielectric layer is self-aligned to the crystalline structure and orientation of the first buffer layer during a formation process for the dielectric layer.

5. A resistive memory device according to claim 1, further comprising a second buffer layer formed on the dielectric layer, wherein the second electrode is formed on the second buffer layer.

6. A resistive memory device according to claim 5, wherein the crystalline structure and orientation of the second buffer layer is self-aligned to the crystalline structure and orientation of the dielectric layer during a formation process for the second buffer layer.

7. A resistive memory device according to claim 1, wherein the dielectric layer is comprised of a Colossal magnetoresistive (CMR) material.

8. A resistive memory device according to claim 7, wherein the CMR material comprises $Pr_{1-x}Ca_xMnO_3$ (PCMO).

9. A resistive memory device according to claim 8, wherein the first buffer layer comprises $LaNiO_3$ (LNO).

10. A resistive memory device according to claim 1, wherein the resistive memory device is a resistive random access memory (RRAM) stack.

11. A resistive random access memory stack, comprising:
a first electrode formed on a substrate;
a first buffer layer formed on the first electrode and having a crystalline structure with a first orientation controlled by its formation process;
a dielectric layer comprising a Colossal magnetoresistive (CMR) material and formed on the first buffer, the dielectric layer having a crystalline structure with an orientation self-aligned to the crystalline structure and orientation of the first buffer layer during a formation process for the dielectric layer, wherein a resistive ratio of the dielectric layer formed on the first buffer layer is greater than a resistive ratio of a device having the dielectric layer formed on the first electrode;
a second buffer layer formed on the dielectric layer and having a crystalline structure with an orientation self-aligned to the crystalline structure and orientation of the dielectric layer during a formation process for the second buffer layer; and
a second electrode formed on the second buffer layer.

12. A resistive random access memory stack according to claim 11, wherein the CMR material comprises $Pr_{1-x}Ca_xMnO_3$ (PCMO).

13. A resistive random access memory stack according to claim 12, wherein the first buffer layer comprises $LaNiO_3$ (LNO).

14. A resistive random access memory stack according to claim 11, wherein the first and second electrodes comprise platinum.

* * * * *